US010411062B2

(12) United States Patent
Kim et al.

(10) Patent No.: US 10,411,062 B2
(45) Date of Patent: Sep. 10, 2019

(54) SUBSTRATE BONDING APPARATUS HAVING ADSORPTION SECTORS WITH DIFFERENT VACUUM PRESSURES AND METHOD OF MANUFACTURING SEMICONDUCTOR DEVICE USING THE SAME

(71) Applicant: Samsung Electronics Co., Ltd., Suwon-si (KR)

(72) Inventors: Jun Hyung Kim, Yongin-si (KR); Seokho Kim, Hwaseong-si (KR); SungHyup Kim, Hwaseong-si (KR); Jaegeun Kim, Seoul (KR); Taeyeong Kim, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 157 days.

(21) Appl. No.: 15/602,185

(22) Filed: May 23, 2017

(65) Prior Publication Data
US 2018/0122845 A1   May 3, 2018

(30) Foreign Application Priority Data

Nov. 2, 2016   (KR) .................. 10-2016-0145375

(51) Int. Cl.
*H01L 21/67*   (2006.01)
*H01L 21/683*   (2006.01)
(Continued)

(52) U.S. Cl.
CPC .......... *H01L 27/1469* (2013.01); *H01L 24/01* (2013.01); *H01L 24/03* (2013.01);
(Continued)

(58) Field of Classification Search
CPC ..... H01L 21/2007; H01L 24/01; H01L 24/03; H01L 24/04; H01L 24/74; H01L 24/80;
(Continued)

(56) References Cited

U.S. PATENT DOCUMENTS 7,682,933 B1   3/2010   Loomis
8,147,630 B2   4/2012   George
(Continued)

FOREIGN PATENT DOCUMENTS

JP   2016-039364 A   3/2016
KR   10-2012-0118968 A   10/2012
(Continued)

*Primary Examiner* — Mohsen Ahmadi
*Assistant Examiner* — Christopher M Roland
(74) *Attorney, Agent, or Firm* — Muir Patent Law, PLLC

(57) ABSTRACT

Disclosed are a substrate bonding apparatus and a method of manufacturing a semiconductor device. The substrate bonding apparatus comprises vacuum pumps, a first chuck engaged with the vacuum pumps and adsorbing a first substrate at vacuum pressure of the vacuum pumps, and a pushing unit penetrating a center of the first chuck and pushing the first substrate away from the first chuck. The first chuck comprises adsorption sectors providing different vacuum pressures in an azimuth direction to the first substrate.

13 Claims, 15 Drawing Sheets

(51) Int. Cl.
*H01L 23/00* (2006.01)
*H01L 27/146* (2006.01)
*H01L 21/20* (2006.01)

(52) U.S. Cl.
CPC .............. *H01L 24/04* (2013.01); *H01L 24/74* (2013.01); *H01L 24/80* (2013.01); *H01L 27/14634* (2013.01); *H01L 27/14683* (2013.01); *H01L 27/14687* (2013.01); *H01L 21/2007* (2013.01)

(58) Field of Classification Search
CPC ......... H01L 27/14634; H01L 27/14683; H01L 27/14687; H01L 27/1469
See application file for complete search history.

(56) References Cited

U.S. PATENT DOCUMENTS

| | | |
|---|---|---|
| 8,851,133 B2 | 10/2014 | Liu et al. |
| 2010/0248446 A1* | 9/2010 | Liu ..................... H01L 21/304 438/459 |
| 2015/0129137 A1 | 5/2015 | Sugihara et al. |
| 2015/0179495 A1* | 6/2015 | Huang ................ H01L 21/6838 356/237.5 |
| 2018/0019279 A1* | 1/2018 | Itonaga ............. H01L 21/76898 |

FOREIGN PATENT DOCUMENTS

| | | |
|---|---|---|
| KR | 10-1383282 B1 | 4/2014 |
| KR | 10-2014-0136710 A | 12/2014 |

\* cited by examiner

SUBSTRATE BONDING APPARATUS HAVING ADSORPTION SECTORS WITH DIFFERENT VACUUM PRESSURES AND METHOD OF MANUFACTURING SEMICONDUCTOR DEVICE USING THE SAME

CROSS-REFERENCE TO RELATED APPLICATIONS

This U.S. nonprovisional patent application claims the benefit of priority under 35 U.S.C § 119 of Korean Patent Application No. 10-2016-0145375, filed on Nov. 2, 2016, the entire contents of which are hereby incorporated by reference.

BACKGROUND

Embodiments relate to a substrate bonding apparatus, and more particularly, to a substrate bonding apparatus and a method of manufacturing a semiconductor device using the same in which a plurality of substrates are bonded.

Semiconductor devices trend toward high integration. For example, stacked semiconductor devices can decrease resistance to reduce wiring lengths and process signals at high speeds. The stacked semiconductor devices may be formed mainly by substrate bonding technology. The substrate bonding technology may include a wafer-to-wafer bonding method.

SUMMARY

Embodiments provide a substrate bonding apparatus and a method of manufacturing a semiconductor device using the same in which substrates can be uniformly bonded in an azimuth direction.

In some aspects, the disclosure is directed to a substrate bonding apparatus, comprising: vacuum pumps; a first chuck connected to the vacuum pumps and configured to adsorb a first substrate at vacuum pressure of the vacuum pumps; and a pushing unit penetrating a center of the first chuck and configured to push the first substrate away from the first chuck, wherein the first chuck comprises a plurality of adsorption sectors providing different vacuum pressures in an azimuth direction with respect to the first substrate.

In some aspects, the disclosure is directed to a method of manufacturing a semiconductor device, the method comprising: fabricating a first substrate; fabricating a second substrate different from the first substrate; and bonding the first substrate to the second substrate, wherein bonding the first substrate to the second substrate comprises providing a first portion of the second substrate with a first vacuum pressure and providing the second portion of the second substrate with a second vacuum pressure that is different from the first vacuum pressure, the first portion of the second substrate separate from the second portion of the second substrate in an azimuth direction.

In some aspects, the disclosure is directed to a method comprising: providing a first substrate; providing a first chuck having first adsorption sectors configured to adsorb the first substrate at a first pressure and second adsorption sectors configured to adsorb the first substrate at a second pressure different from the first pressure; adsorbing the first substrate to the first chuck; and pushing the first substrate away from the first chuck by pushing the first substrate at a center of the first substrate.

DETAILED DESCRIPTION OF EMBODIMENTS

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes such semiconductor devices may also be referred to generally as a semiconductor device.

As used herein, items described as being "fluidly connected" are configured such that a liquid or gas can flow, or be passed, from one item to the other. Herein, Miller indices may be used to specify direction and plane in crystal (Bravais) lattices.

Figure 1:
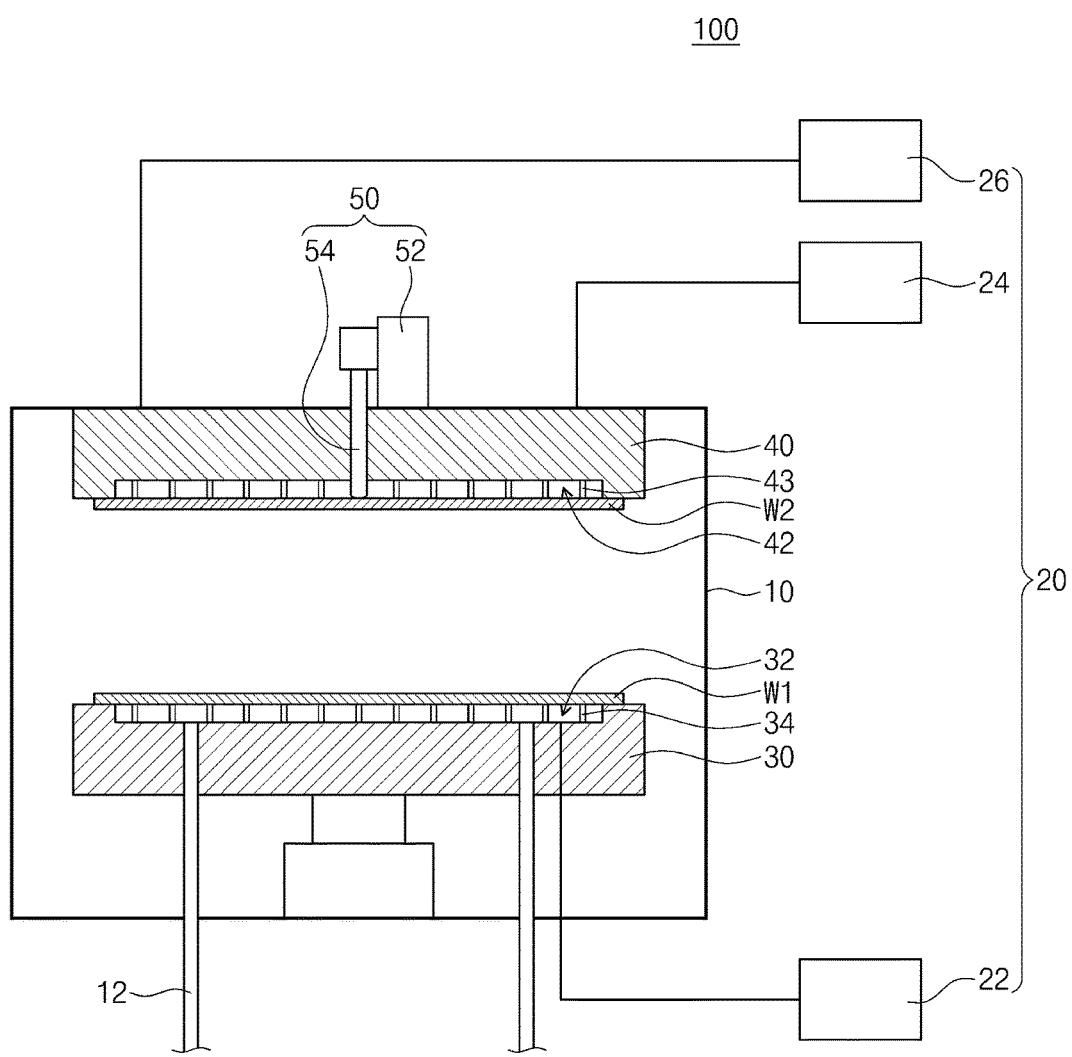
FIGS. 1 and 2 are schematic sectional views illustrating a substrate bonding apparatus, according to certain exemplary embodiments.
Figure 2:
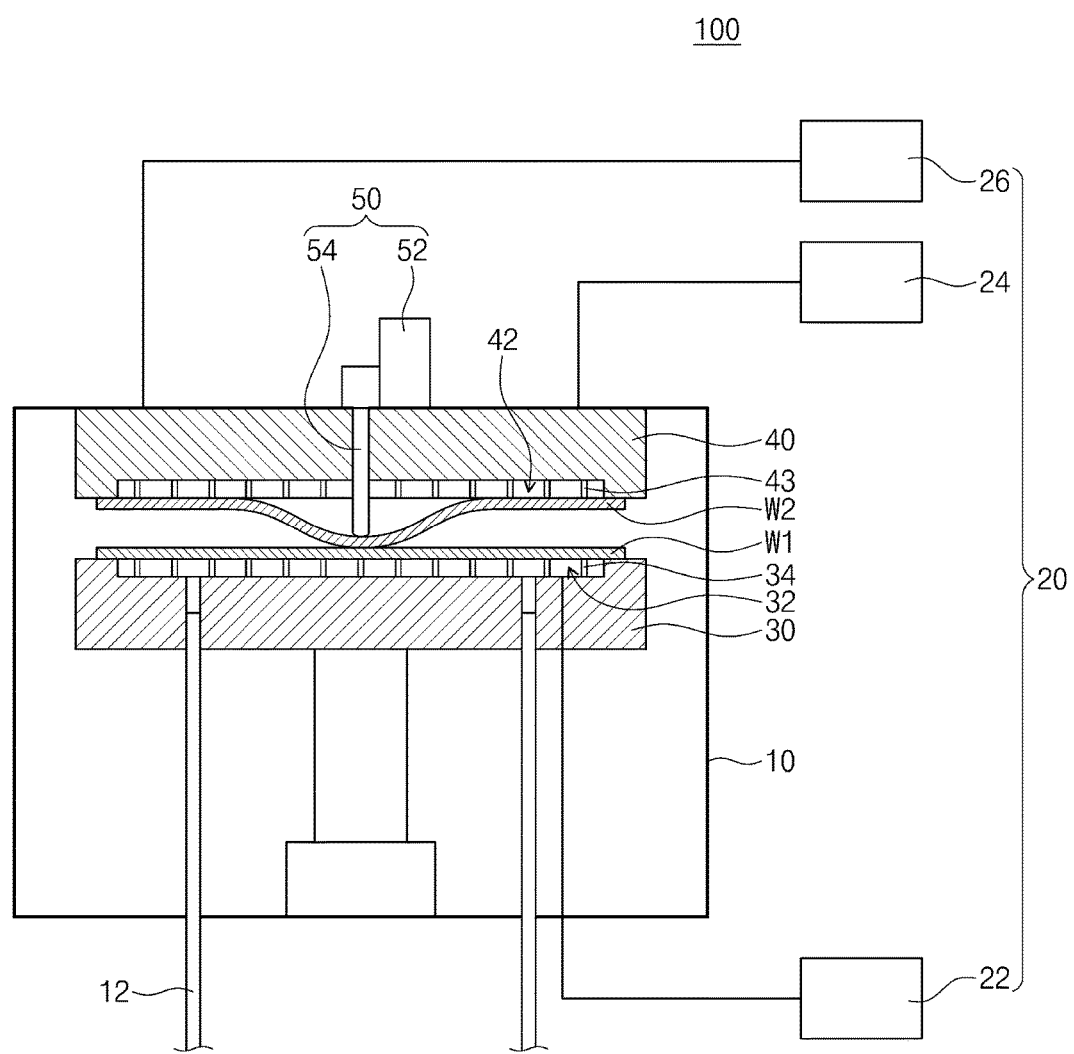

FIGS. 1 and 2 show a substrate bonding apparatus 100 according to some embodiments.

Referring to FIG. 1, the substrate bonding apparatus 100 of the exemplary embodiments may include a chamber 10, vacuum pumps 20, a lower chuck 30, an upper chuck 40, and a pushing unit 50.

The chamber 10 may surround the lower and upper chucks 30 and 40. For example, the chamber 10 may be sealed and set to provide vacuum pressure or atmosphere pressure. The chamber 10 may protect lower and upper substrates W1 and W2, respectively on the lower and upper chucks 30 and 40, from exposure to the environment outside of the chamber 10.

The vacuum pumps 20 may be installed outside the chamber 10. The vacuum pumps 20 may be engaged with the lower and upper chucks 30 and 40. For example, the vacuum pumps 20 may include first, second, and third vacuum pumps 22, 24, and 26. The first vacuum pump 22 may be engaged with the lower chuck 30. The second and third vacuum pumps 24 and 26 may be engaged with the upper chuck 40.

The lower chuck 30 may be disposed in a lower portion of the chamber 10. The lower chuck 30 may receive the lower substrate W1. The lower chuck 30 may be provided therethrough with lift pins 12. A robot (not shown) may be provided in the lower substrate W1 above the lift pins 12. When the lift pins 12 descend, the lower substrate W1 may be placed on the lower chuck 30. The lower chuck 30 may adsorb the lower substrate W1 at pumping pressure and/or vacuum pressure generated from the first vacuum pump 22. For example, the pumping pressure and/or vacuum pressure generated from the first vacuum pump 22 may cause the lower substrate W1 to be retained against the lower chuck 30.

The upper chuck 40 may be disposed in an upper portion of the chamber 10. The robot may provide the upper substrate W2 below the upper chuck 40. The upper chuck 40 may adsorb the upper substrate W2 at pumping pressure and/or vacuum pressure generated from the second and third vacuum pumps 24 and 26. For example, the pumping pressure and/or vacuum pressure generated from the second and third vacuum pumps 24 and 26 may cause the upper substrate W2 to be retained against the upper chuck 40. The upper chuck 40 may face the lower chuck 30. When the upper chuck 40 adsorbs the upper substrate W2, the lower chuck 30 may move toward the upper chuck 40. The upper and lower substrates W2 and W1 may be close to each other. For example, the lower substrate W1 may be close to the upper substrate W2 at a distance of about 3 mm to about 2 cm. For example, the lower substrate W1 and the upper substrate W2 may be spaced apart from one another within a range of about 3 mm to about 2 cm.

Referring to FIG. 2, the pushing unit 50 may be disposed at and through a center of the upper chuck 40. The pushing unit 50 may push the upper substrate W2 toward the lower chuck 30, which carries the lower substrate W1. The upper substrate W2 may then be bonded to the lower substrate W1. For example, the pushing unit 50 may push the upper substrate W2 into contact with the lower substrate W1, causing the upper substrate W2 and the lower substrate W1 to form a physical connection to one another. The pushing unit 50 may include, for example, an actuator 52 and a pusher 54. The actuator 52 may be installed on the upper chuck 40. The actuator 52 may include a motor or a gear. The actuator 52 may drive to move the pusher 54. The pusher 54 may be disposed through the upper chuck 40. For example, the pusher 54 may extend through the upper chuck 40, from a top surface to a bottom surface of the upper chuck 40. The pusher 54 may include a shaft. The pusher 54 may push a center of the upper substrate W2 away from the upper chuck 40.

The center of the upper substrate W2 may be bonded to a center of the lower substrate W1. When vacuum pressure of the second and third vacuum pumps 24 and 26 is removed, an edge of the upper substrate W2 may be bonded to an edge of the lower substrate W1. For example, when the vacuum pressure of the second and third vacuum pumps 24 and 26 is removed, the edge of the upper substrate W2 may no longer be retained against the upper chuck 40, and the edge of the upper substrate W2 may move toward the edge of the lower substrate W1. Therefore, the lower and upper substrates W1 and W2 may eventually be bonded to each other. In contrast, when vacuum pressure of the first vacuum pump 22 is removed, the lower substrate W1 may move toward the upper substrate W2. The edge of the upper substrates W2 may be bonded to the edge of the lower substrate W1. The lower and upper substrates W1 and W2 may be bonded from their centers to their edges.

Figure 3:
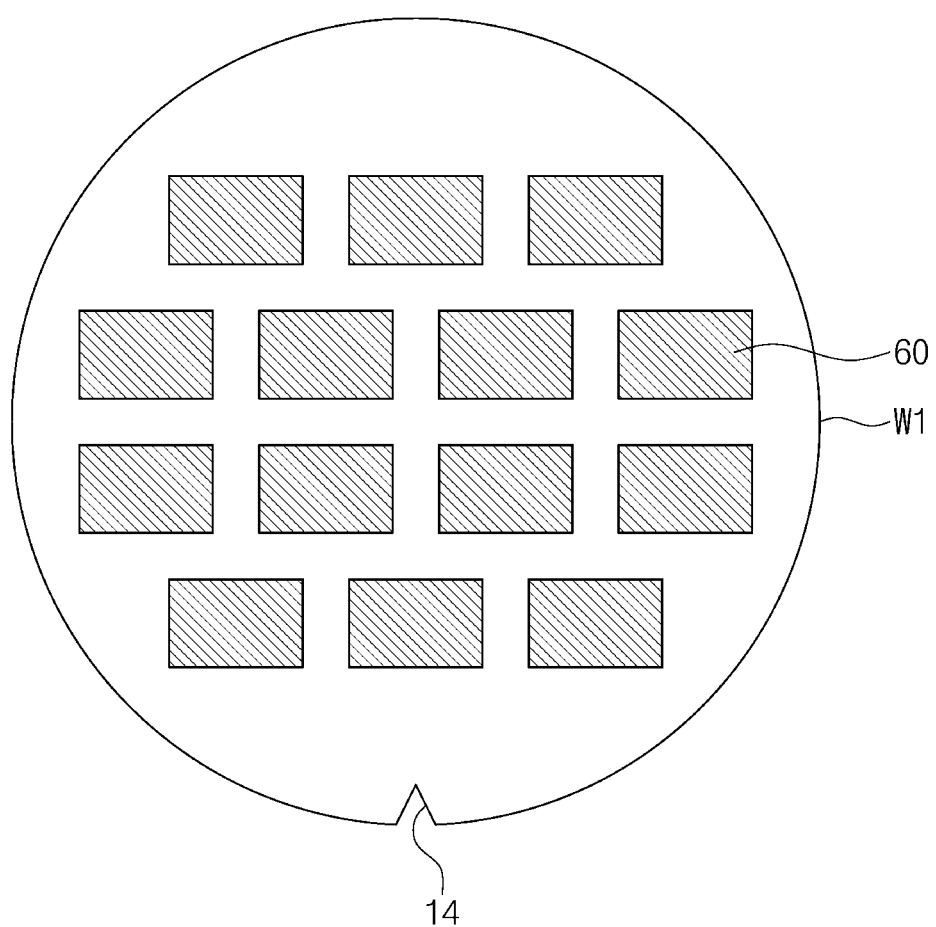
FIG. 3 is a plan view illustrating a lower substrate of FIG. 1.

FIG. 3 shows an example of the lower substrate W1 of FIG. 1.

Referring to FIG. 3, the lower substrate W1 may include a silicon wafer. A top surface of the silicon wafer may mainly have a (100) crystal plane. The lower substrate W1 may have, for example, a circular shape. Alternatively, the lower substrate W1 may include glass or plastic. In an embodiment, the lower substrate W1 may have a first notch 14 and a plurality of first semiconductor devices 60. The first notch 14 may be located on the circumference of the lower substrate W1. The first notch 14 may denote a crystal direction of the lower substrate W1 having the (100) crystal plane. For example, the first notch 14 may indicate a [110] crystal direction of silicon having a (100) crystal plane. Alternatively, the first notch 14 may indicate a <110> family of crystal direction of silicon having the (100) crystal plane. In some embodiments, the location of the first notch 14 may indicate the crystal direction of the lower substrate W1. For example, the direction of the first notch 14 may correspond to a [110] crystal direction. The first semiconductor devices 60 may be disposed on a top surface of the lower substrate W1. For example, the first semiconductor devices 60 may include a pixel array of CMOS image sensor. Alternatively, the first semiconductor devices 60 may include a photodiode or a display device.

Figure 4:
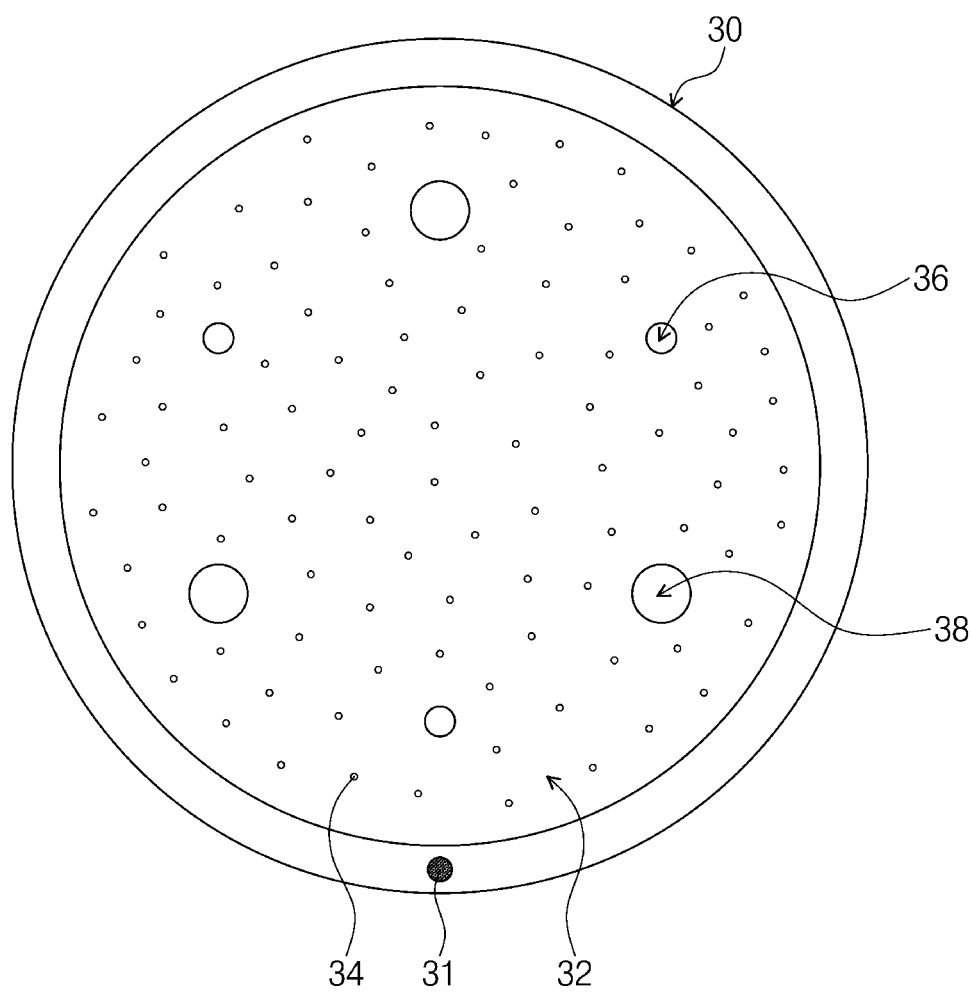
FIG. 4 is a plan view illustrating an example of a lower chuck shown in FIG. 1.

FIG. 4 shows an example of the lower chuck 30 shown in FIG. 1.

Referring to FIGS. 1, 3, and 4, the lower chuck 30 may include a first alignment part 31, a lower recess 32, first support pins 34, first vacuum holes 36, and pin holes 38.

The first alignment part 31 may align the lower substrate W1. For example, the first alignment part 31 may include an alignment pin. The first alignment part 31 may be coupled to the first notch 14. For example, the first alignment part 31 may be formed such that it fits within the first notch 14. The first alignment part 31 may align the lower substrate W1 in the [110] crystal direction on the lower chuck 30. In some embodiments, the indication of the crystal direction of the lower substrate W1 may be provided when the first alignment part 31 and the first notch 14 are coupled such that they align the lower substrate W1 in the [110] crystal direction.

The lower recess 32 may be formed on a top surface of the lower chuck 30. The lower chuck 30 may have a central region, except its edge, where the lower recess 32 is chiefly formed. For example, the central region may be formed at a center of the lower chuck 30 and extend to include all but the edge of the lower chuck 30. The lower recess 32 may separate the lower substrate W1 from the central region of the lower chuck 30.

The first support pins 34 may be disposed in the lower recess 32. The first support pins 34 may support the lower substrate W1. The lower substrate W1 may also be supported by the edge of the lower chuck 30 outside the lower recess 32. For example, the edge of the lower chuck 30 may support the sides of the lower substrate W1.

The first vacuum holes 36 may connect the lower recess 32 to the first vacuum pump 22. For example, the first vacuum holes 36 may fluidly couple the lower recess 32 to the first vacuum pump 22. The first vacuum holes 36 may be disposed in the lower recess 32. The first vacuum holes 36 may be disposed to correspond to vertices of a triangle in the lower recess 32. Alternatively, the first vacuum holes 36 may be randomly arranged. When the first vacuum pump 22 evacuates air from the lower recess 32, vacuum pressure generated from the first vacuum pump 22 may be provided through the lower recess 32 to the lower chuck 30. The lower substrate W1 may be adsorbed on the lower chuck 30 by vacuum pressure and/or pumping pressure generated from the first vacuum pump 22. The vacuum pressure of the first vacuum pump 22 may correspond to an adsorption force of the lower substrate W1. The lower substrate W1 may be prevented from deformation by the first support pins 34 and the edge of the lower chuck 30 outside the lower recess 32. For example, the first support pins 34 and the edge of the lower chuck 30 surrounding the lower substrate W1 may provide support for the lower substrate W1, allowing the lower substrate W1 to maintain its shape.

The pin holes 38 may provide movement paths of the lift pins 12. For example, the pin holes 38 may provide the shafts through which the lift pins 12 move. When the lower substrate W1 is adsorbed on the lower chuck 30, the lift pins 12 may close or seal the pin holes 38. When the lower substrate W1 is released from the lower chuck 30, the lift pins 12 may retract, opening the pin holes 38. For example, the pin holes 38 may be disposed in the lower recess 32. In one embodiment, the number of the pin holes 38 may be three. For example, the pin holes 38 may occupy positions corresponding to vertices of a triangle. The pin holes 38 and the first vacuum holes 36 may be disposed in symmetrical positions. For example, when the pin holes 38 are disposed to correspond to vertices of a particular triangle, the first vacuum holes 36 may be disposed to correspond to vertices of a reverse triangle.

Figure 5:
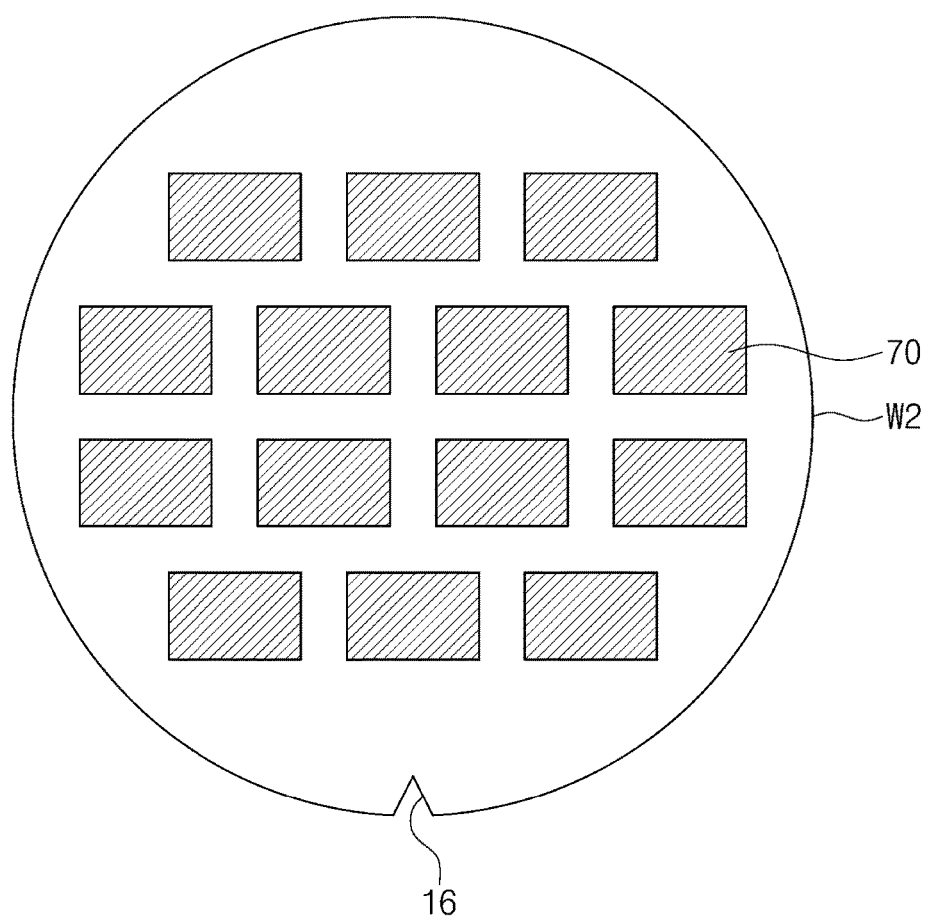
FIG. 5 is a plan view illustrating an upper substrate of FIG. 1.

FIG. 5 shows an example of the upper substrate W2 of FIG. 1.

Referring to FIG. 5, the upper substrate W2 may include a silicon wafer. The silicon wafer may mainly have a (100) crystal plane. Alternatively, the upper substrate W2 may include glass or plastic. The upper substrate W2 may have the same circular shape as that of the lower substrate W1. In an embodiment, the upper substrate W2 may have a second notch 16 and a plurality of second semiconductor devices 70. The second notch 16 may be located on the circumference of the upper substrate W2. The second notch 16 may denote a crystal direction of the upper substrate W2 having a (100) crystal plane. For example, the second notch 16 may indicate a [110] crystal direction of silicon having a (100) crystal plane. Alternatively, the second notch 16 may indicate a <110> family of crystal direction of silicon having the (100) crystal plane. In some embodiments, the location of the second notch 16 may indicate the crystal direction of the upper substrate W2. For example, the direction of the second notch 16 may correspond to a [110] crystal direction. The second semiconductor devices 70 may be disposed on a top surface of the upper substrate W2. For example, each of the second semiconductor devices 70 may include a driving member. The driving member may include a scan driver, a gate drive, and/or a data driver. Alternatively, the second semiconductor devices 70 may include a power supply member, a signal processing member, a signal delay member, and/or a control member.

Figure 6:
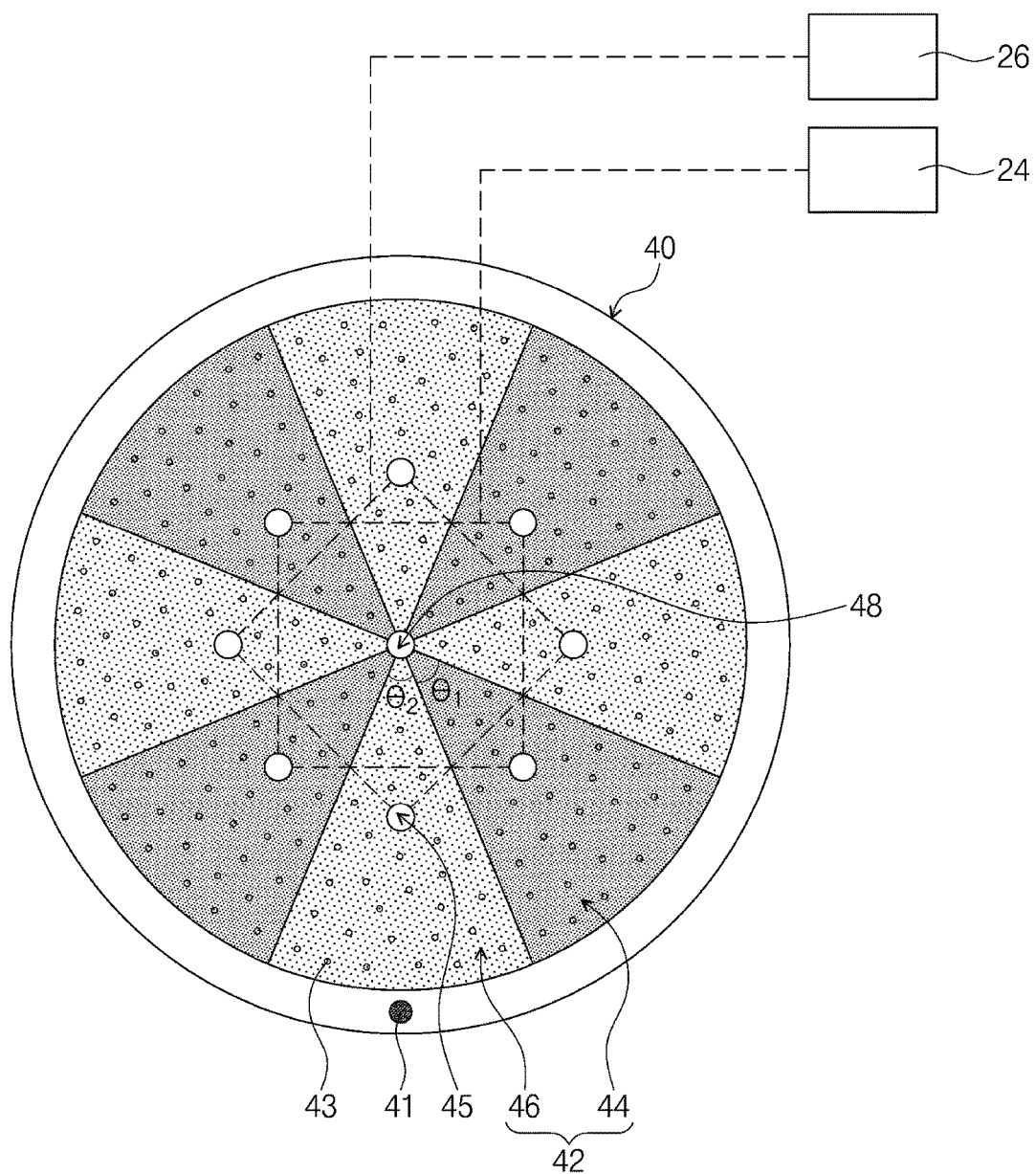
FIG. 6 is a plan view illustrating an example of an upper chuck shown in FIG. 1.

FIG. 6 shows an example of the upper chuck 40 shown in FIG. 1.

Referring to FIGS. 1, 5, and 6, the upper chuck 40 may include a second alignment part 41, adsorption sectors 42, and a pusher hole 48.

The second alignment part 41 may align the upper substrate W2. For example, the second alignment part 41 may include an alignment pin. The second alignment part 41 may be disposed on the edge of the upper substrate W2 outside the adsorption sectors 42. The second alignment part 41 may be coupled to the second notch 16 of the upper substrate W2. For example, the second alignment part 41 may be formed such that it fits within the second notch 16. The second alignment part 41 may align the upper substrate W2 in the [110] crystal direction on the upper chuck 40.

The adsorption sectors 42 may be arranged in an azimuth direction of the upper chuck 40. The adsorption sectors 42 may be substantially equally-sized segments that, when taken together, form a circular shape. For example, each of the adsorption sections 42 may be pie-shaped segments having two linear sides that meet at a vertex and an arc shape side opposite the vertex. The angle formed at the vertex of each adsorption sector 42 may be referred to as the azimuth angle (e.g., first and second azimuth angles θ1 and θ2, discussed further below in connection with FIG. 6). The plurality of adsorption sectors 42 may be arranged on the upper chuck 40 such that the vertices of the adsorption sections 42 meet at a center point on the upper chuck 40. For example, the adsorption sectors 42 may be arrayed around a center point of the upper chuck 40. The sum of the azimuth angles corresponding to all of the adsorption sectors 42 arrayed around the center point of the upper chuck 40 may be 360°.

The adsorption sectors 42 may be connected to the second and third vacuum pumps 24 and 26. In an embodiment, the adsorption sectors 42 may include high-pressure adsorption sectors 44 and low-pressure adsorption sectors 46. Each of the high-pressure and low-pressure adsorption sectors 44 and 46 may correspond to an upper recess. The upper recess may be formed on a top surface of the upper chuck 40. For example, the upper recess may be formed at a center of the upper chuck 40 and extend to include all but the edge area of the upper chuck 30. Each of the high-pressure and low-pressure adsorption sectors 44 and 46 may include second vacuum holes 43 and second support pins 45. The second vacuum holes 43 may be connected to the second or third vacuum pump 24 or 26. For example, the second vacuum holes 43 may fluidly couple the upper recess of the upper chuck 40 to the second or third vacuum pumps 24 or 26. The second support pins 45 may support the upper substrate W2.

The second vacuum holes 43 of the high-pressure adsorption sectors 44 may be connected to the second vacuum pump 24. The high-pressure adsorption sectors 44 may adsorb portions of the upper substrate W2 at vacuum pressure generated from the second vacuum pump 24. Each of the high-pressure adsorption sectors 44 may have a first azimuth angle θ1. The first azimuth angle θ1 may be about 45°. In some embodiments, when the first azimuth angle θ1 is about 45°, there may be four high-pressure adsorption sectors 44.

The second vacuum holes 43 of the low-pressure adsorption sectors 46 may be connected to the third vacuum pump 26. Vacuum pressure generated from the third vacuum pump 26 may be less than that generated from the second vacuum pump 24. The low-pressure adsorption sectors 46 may adsorb other portions of the upper substrate W2 at vacuum pressure generated from the third vacuum pump 26. Each of the low-pressure adsorption sectors 46 may have a second azimuth angle θ2. The second azimuth angle θ2 may be the same as the first azimuth angle θ1. The second azimuth angle θ2 may be about 45°. In this example, when the second azimuth angle θ2 is about 45°, there may be four low-pressure adsorption sectors 44. In an embodiment, the second alignment part 41 may be disposed close to one of the low-pressure adsorption sectors 46. The low-pressure adsorption sectors 46 may adsorb the upper substrate W2 with respect to the [110] crystal direction at vacuum pressure less than that of the high-pressure adsorption sectors 44.

The pusher hole 48 may be disposed at the center of the upper chuck 40. For example, the pusher hole 48 may be disposed on a common point where the adsorption sectors 42 meet. For example, the pusher hole 48 may be located at a vertex of the adsorption sectors 42. The pusher hole 48 may provide a movement path of the pusher 54. For example, the pusher hole 48 may have a size (e.g., a diameter) greater than those of the second vacuum holes 43.

Referring to FIGS. 2 and 6, when the pusher 54 pushes the upper substrate W2 away from the upper chuck 40 (e.g., toward the lower chuck 30), the upper substrate W2 may be deformed on its center. Deformation of the upper substrate W2 may be expressed by Young's modulus. For example, deformation force may be in inverse proportion to Young's modulus. Young' modulus may be calculated by taking the reciprocal of deformation force. Young' modulus may be a ratio of pressure to deformation of the upper substrate W2.

The high-pressure adsorption sectors 44 may adsorb low Young's modulus portions (e.g., largely deformed portions) of the upper substrate W2. The low-pressure adsorption sectors 46 may adsorb high Young's modulus portions (e.g., slightly deformed portions) of the upper substrate W2. As a result, when the pusher 54 pushes the upper substrate W2 away from the upper chuck 40, the high-pressure and low-pressure adsorption sectors 44 and 46 may uniformly deform the upper substrate W2 in an azimuth direction.

Figure 7:
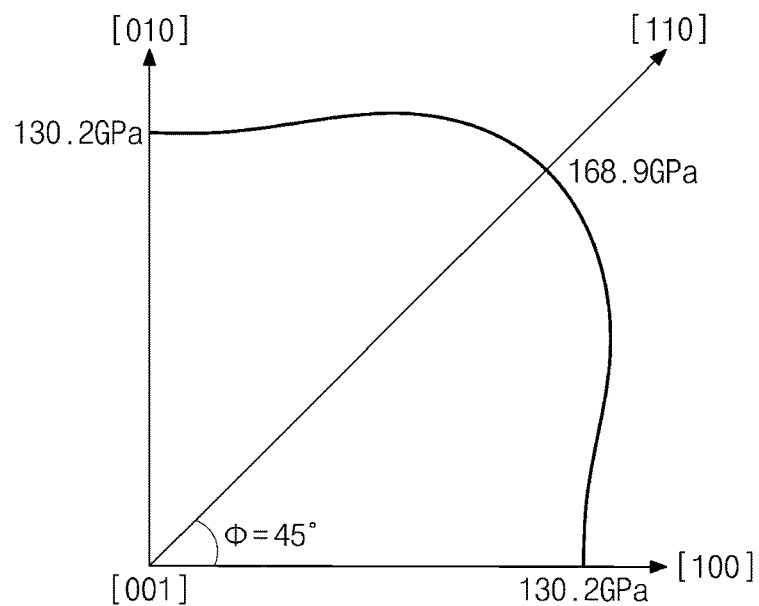
FIG. 7 is a graph showing Young's modulus according to a crystal direction of the upper substrate of FIG. 5.

FIG. 7 shows Young's modulus depending on a crystal direction of the upper substrate W2 of FIG. 5.

Referring to FIG. 7, Young's modulus may be greater along the [110] crystal direction than along the [100] or [010] crystal direction. For example, when the [001] crystal direction corresponds to the center of the upper substrate W2, the upper substrate W2 may have Young's modulus of about 130.2 Giga Pascal (GPa) in the [100] and [010] crystal directions. The upper substrate W2 may have Young's modulus of about 168.9 GPa in the [110] crystal direction. The [100] and [010] crystal directions may have an azimuth angle Φ of about 45° relative to the [110] crystal direction.

Referring to FIGS. 5 to 7, the high-pressure and low-pressure adsorption sectors 44 and 46 may uniformly deform the upper substrate W2 in the [100], [101], and [110] crystal directions. For example, the low-pressure adsorption sectors 46 may adsorb the upper substrate W2 in the [110] crystal direction. The low-pressure adsorption sectors 46 may adsorb the upper substrate W2 at vacuum pressure less than that at the high-pressure adsorption sectors 44. For example, the low-pressure adsorption sectors 46 may adsorb the upper substrate W2 at vacuum pressure of about 130.2 Pa or 1.302 hPa. The high-pressure adsorption sectors 44 may adsorb the upper substrate W2 in the [100] and [010] crystal directions. For example, the high-pressure adsorption sectors 44 may adsorb the upper substrate W2 at vacuum pressure of about 168.9 Pa or 1.689 hPa. As such, the upper substrate W2 may be uniformly deformed in a diameter direction and/or in an azimuth direction. For example, the upper substrate W2 may remain radially and bilaterally symmetric, and may deform in a vertical direction substantially the same way for all azimuth angles. As discussed above, the first substrate may be aligned with the first chuck so that the low pressure adsorption sectors 46 align with first portions of the upper substrate W2 having a [110] crystal direction aligned radially from a center of the substrate toward an edge of the substrate, and the high pressure adsorption sectors 44 align with second portions of the upper substrate W2 having a [100] or [010] crystal direction aligned radially from a center of the substrate toward an edge of the substrate.

Figure 8:
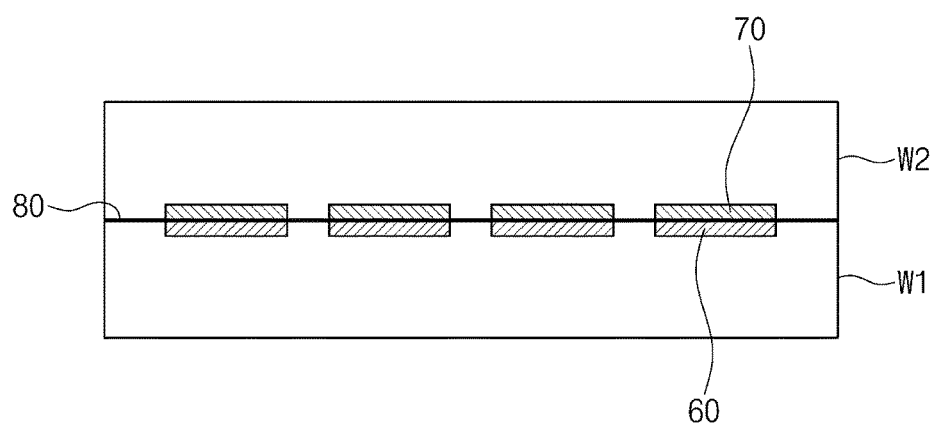
FIG. 8 is a cross-sectional view illustrating lower and upper substrates of FIG. 1.

FIG. 8 shows the lower and upper substrates W1 and W2 of FIG. 1.

Referring to FIGS. 1, 2, and 8, the lower and upper substrates W1 and W2 may be gradually bonded to each other from their centers to their edges. For example, an adhesive layer 80 may be provided to bond the lower and upper substrates W1 and W2. The upper substrate W2 may be aligned with the lower substrate W1. The upper substrate W2 may be bonded to the lower substrate W1 without being deformed. It thus may be possible to prevent failure of bonding and alignment between the lower and upper substrates W1 and W2. The first and second semiconductor devices 60 and 70 may be connected in one-to-one correspondence. The first semiconductor device 60 may be disposed on the top surface of the lower substrate W1. The lower substrate W1 may be polished on its backside surface (e.g., a surface that is opposite that of its upper surface).

Figure 9:
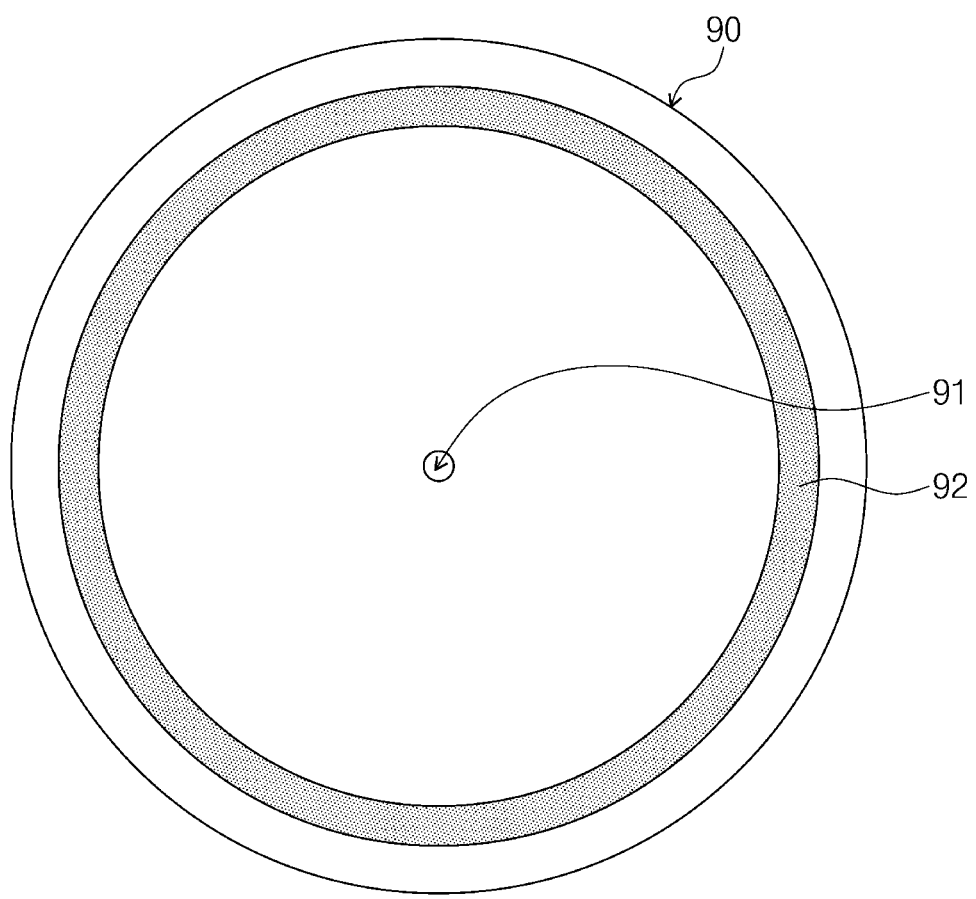
FIG. 9 is a plan view illustrating an upper chuck according to a comparative example.
Figure 10:
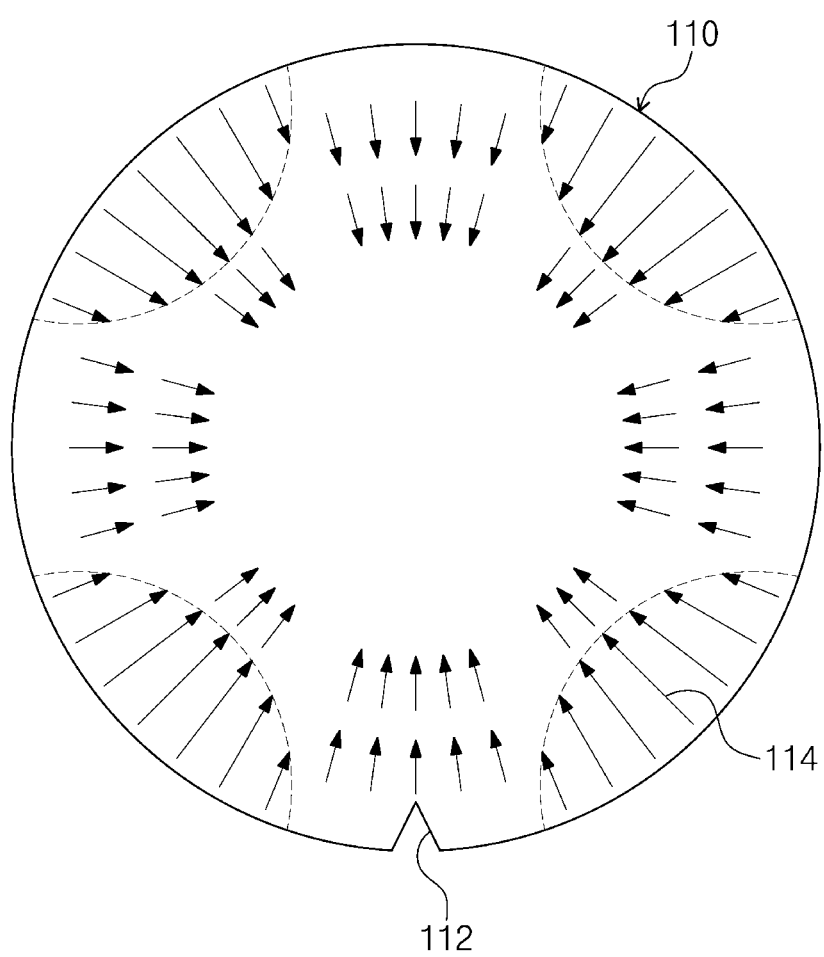
FIG. 10 is a plan view illustrating an upper substrate bonded to a lower substrate by the upper chuck of FIG. 9.

FIG. 9 shows an upper chuck 90 according to a comparative example. FIG. 10 shows an upper substrate 110 adsorbed on the upper chuck 90 of FIG. 9.

Referring to FIG. 9, the comparative upper chuck 90 may include a pusher hole 91 and an adsorption ring section 92. The pusher hole 91 may be disposed on a center of the upper chuck 90. The adsorption ring section 92 may be disposed on an edge of the upper chuck 90. For example, the adsorption ring section 92 may be formed along a circumference of the upper chuck 90.

Referring to FIGS. 9 and 10, the adsorption ring section 92 may adsorb an edge of the upper substrate 110. The adsorption ring section 92 may irregularly deform the edge of the upper substrate 110. Arrows 114 may denote deformation force exerted on the upper substrate 110. Each of the arrows 114 may have a length corresponding to magnitude of the deformation force. The upper substrate 110 may have an upper notch 112 whose direction corresponds to a [110] crystal direction. A [100] or [010] crystal direction may be at an angle of about 45° with respect to the [110] crystal direction. The deformation force may be less along the [110] crystal direction than along the [100] and [101] crystal directions. The upper substrate 110 may thus be less deformed in the [110] crystal direction than in the [100] and [101] crystal directions.

Figure 11:
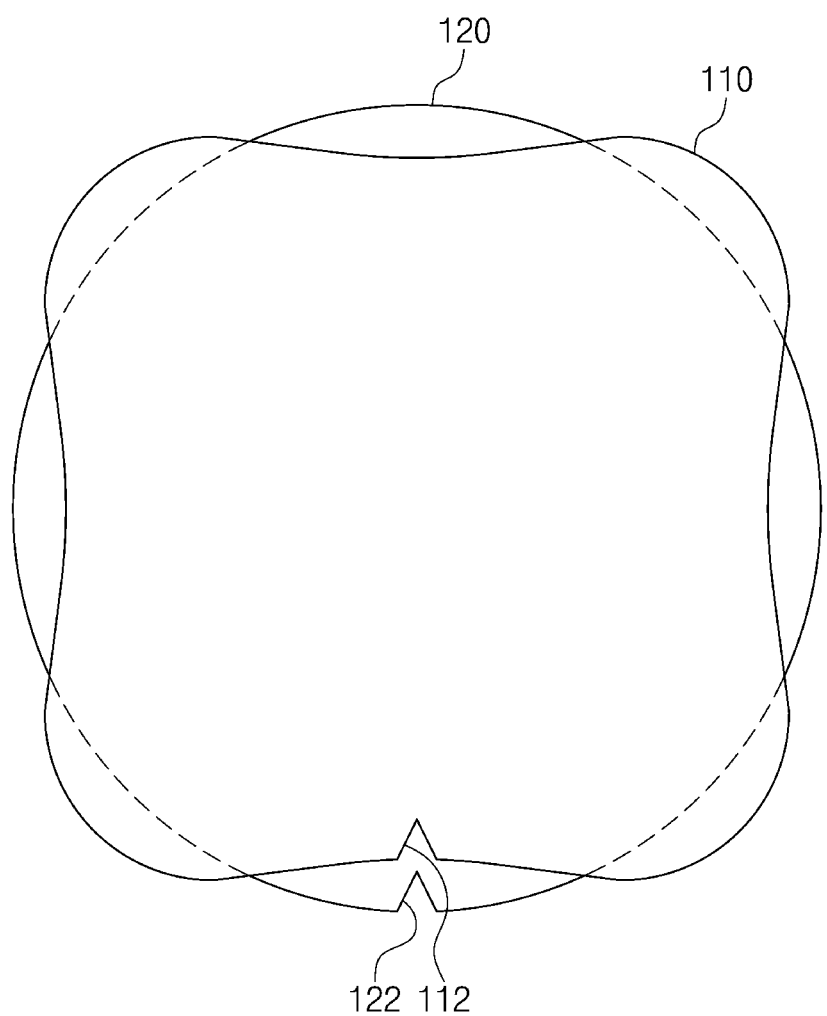
FIG. 11 is a plan view illustrating an upper substrate adsorbed on the upper chuck of FIG. 9.
Figure 12:
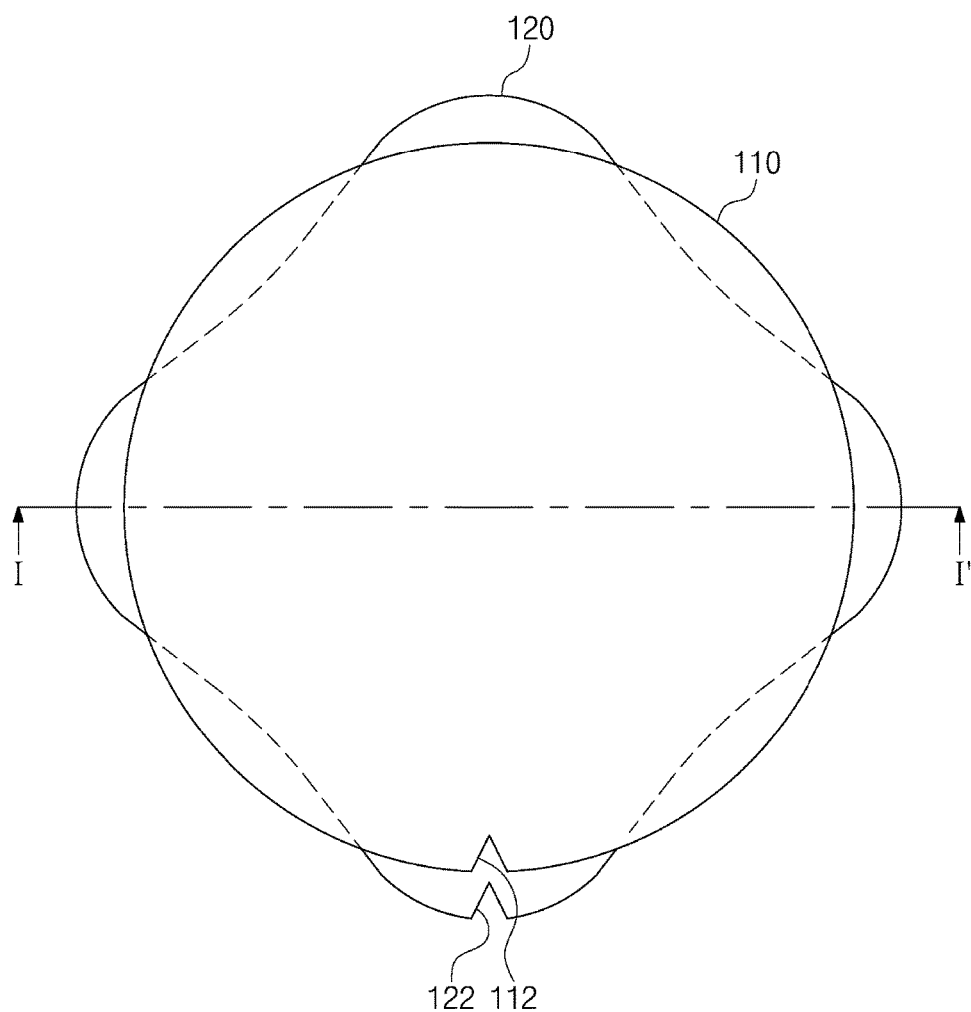
FIG. 12 is a plan view illustrating an upper substrate separated from the upper chuck of FIG. 9.

FIG. 11 shows the upper substrate 110 adsorbed on the upper chuck 90 of FIG. 9. FIG. 12 shows the upper substrate 110 separated from the upper chuck 90 of FIG. 9.

Referring to FIGS. 9 to 11, when a pusher pushes the upper substrate 110 away from the upper chuck 90, the upper substrate 110 may be deformed into a square shape. A lower substrate 120 may have a circular shape. When the lower substrate 120 is bonded to the upper substrate 110, the upper substrate 110 may be separated from the upper chuck 90.

Referring to FIG. 12, when the bonded lower substrate 120 is polished, the upper substrate 110 may be recovered to its original circular shape. This may be because that the polished lower substrate 120 is thinner than the upper substrate 110. In contrast, the polished lower substrate 120 may be deformed into a square shape. The square shape of the lower substrate 120 may be arranged in a diagonal direction of the square shape of the upper substrate 110 shown in FIG. 11. For example, the square shape of the lower substrate 120 may be turned at a 45° angle relative to the square shape of the upper substrate 110.

Figure 13:
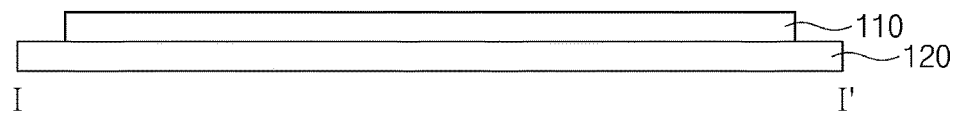
FIG. 13 is a cross-sectional view taken along line I-I' of FIG. 12.

FIG. 13 is a cross-sectional view taken along line I-I' of FIG. 12.

Referring to FIGS. 12 and 13, the upper substrate 110 may not be aligned with the lower substrate 120. For example, the lower substrate 120 may be longer than the upper substrate 110 in a direction of upper and lower notches 112 and 122, for example, in the [110]crystal direction. For example, the lower substrate 120 may be distorted such that it is distended away from the center at the lower notch 122.

Referring to FIGS. 12 and 13, the upper substrate 110 may not be aligned with the lower substrate 120. For example, the lower substrate 120 may be longer than the upper substrate 110 in a direction of upper and lower notches 112 and 122, for example, in the [110] crystal direction. For example, the lower substrate 120 may be distorted such that it is distended away from the center at the lower notch 112.

Referring back to FIGS. 2 and 5 to 8, the high-pressure adsorption sectors 44 may adsorb the upper substrate W2 at high adsorption forces in the [100] and [010] crystal directions, and the low-pressure adsorption sectors 46 may adsorb the upper substrate W2 at low adsorption forces in the [100] crystal direction. The high-pressure and low-pressure adsorption sectors 44 and 46 may adsorb the upper substrate W2 at uniform adsorption forces in the azimuth direction (e.g., for all different azimuth angles). When the pusher 54 pushes the upper substrate W2 away from the upper chuck 40, the upper substrate W2 may be deformed into a circular shape in the azimuth direction. For example, the deformation profile may have the same shape from a center of the upper substrate W2 to the edge of the upper substrate W2 for all different azimuth angles. The upper substrates W2 may be bonded to the lower substrate W1 while still maintaining an original circular shape.

When the upper substrate W2 is separated from the upper chuck 40, the lower substrate W1 may not be deformed by the upper substrate W2. The lower substrate W1 may have a circular shape. The upper substrate W2 may have the same length as that of the lower substrate W1. The high-pressure and low-pressure adsorption sectors 44 and 46 may thus prevent or minimize deformation of the lower substrate W1.

Figure 14:
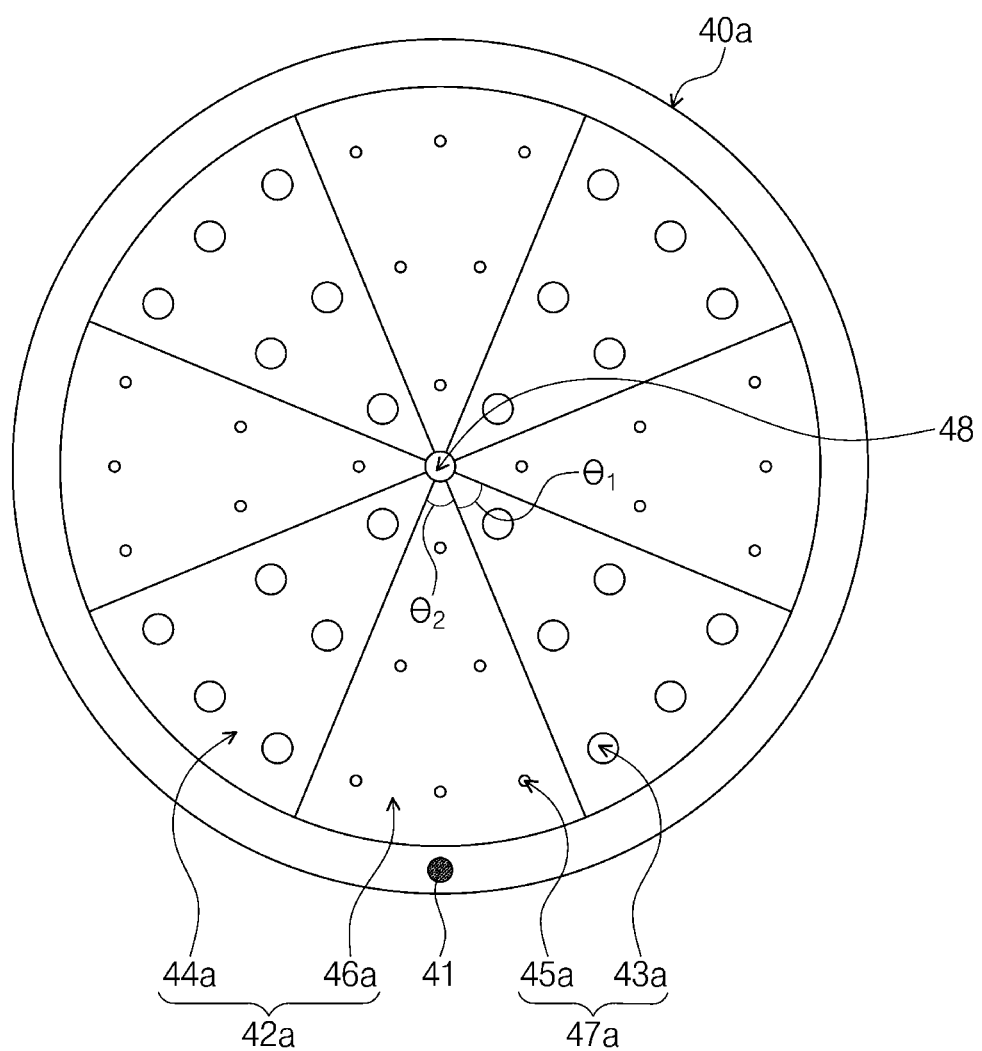
FIG. 14 is a plan view illustrating an example of an upper chuck shown in FIG. 1.

FIG. 14 shows an example of an upper chuck shown in FIG. 1.

Referring to FIGS. 1 and 14, an upper chuck 40a may include circle adsorption holes 47a. In an embodiment, the circle adsorption holes 47a may include first circle holes 43a and second circle holes 45a. The circle adsorption holes 47a may be elliptical or circular in shape.

The first circle holes 43a may be disposed in high-pressure adsorption sectors 44a. The first circle holes 43a may be connected to the second vacuum pump 24. For example, the first circle holes 43a may fluidly couple the high-pressure adsorption sectors 44a to the second vacuum pump 24. Each of the first circle holes 43a may have a same diameter.

The second circle holes 45a may be disposed in low-pressure adsorption sectors 46a. Each of the second circle holes 45a may have a same diameter. The second circle holes 45a may be smaller than the first circle holes 43a. For example, each of the second circle holes 45a may have a diameter greater than that of the first circle holes 43a. The second circle holes 45a may be connected to the third vacuum pump 26. For example, the second circle holes 45a may fluidly couple the low-pressure adsorption sectors 46a to the third vacuum pump 26.

The first and second circle holes 43a and 45a may be symmetrically arranged around a pusher hole 48 penetrating a center of the upper chuck 40a. The first and second circle holes 43a and 45a may be separated from each other in directions of first and second azimuth angles θ1 and θ2. For example, the first and second circle holes 43a and 45a may have the same number. For example, there may be an equal number of first and second circle holes 43a and 45a. The first and second circle holes 43a and 45a may directly provide the upper substrate W2 with vacuum pressure generated from the second and third vacuum pumps 24 and 26, respectively. When the second and third vacuum pumps 24 and 26 generate the same vacuum pressure and/or pumping pressure, or if only one vacuum pump is used to generate a single vacuum pressure over the entire upper chuck 40a, a respective one of the second circle holes 45a may have an area less than that of one of the first circle hole 43a. Adsorption force may be calculated by multiplying vacuum pressure by area. The low-pressure adsorption sector 46a may have pressure less than that of the high-pressure adsorption sector 44a. Therefore, the low-pressure and high-pressure adsorption sectors 46a and 44a may uniformly deform the upper substrate W2 because of the different crystal directions of the different sections of the upper substrate W2, substrate sections that naturally would deform more (e.g., are more prone to deformation) are paired with adsorption sectors that have higher pressure adsorption, and substrate sections that naturally would deform less (e.g., are less prone to deformation) are paired with adsorption sectors that have lower pressure adsorption.

Figure 15:
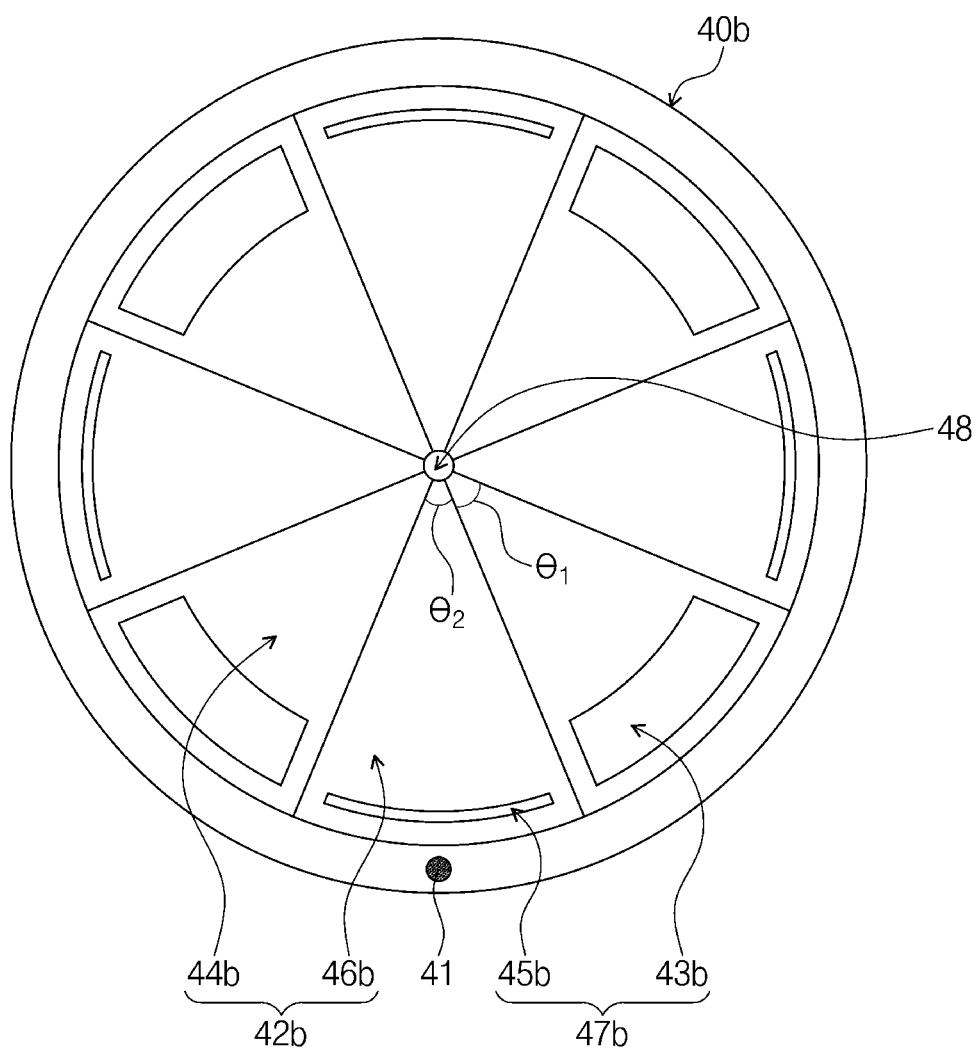
FIG. 15 is a plan view illustrating an example of an upper chuck shown in FIG. 1.

FIG. 15 shows an example of an upper chuck shown in FIG. 1.

Referring to FIGS. 1 and 15, an upper chuck 40b may include arc adsorption holes 47b. The arc adsorption holes 47*b* may include first arc holes 43*b* and second arc holes 45*b*. Each of the first arc holes 43*b* may have a same sized opening, and each of the second arc holes 45*b* may have a same sized opening. The arc adsorption holes 47*b* may have a four-sided shape such that two linear sides mirror one another (e.g., have a same length and extend in opposite directions) and two arcing sides parallel one another (e.g., have a same arc shape with different lengths).

The first arc holes 43*b* may be disposed in high-pressure adsorption sectors 44*b*. Each of the first arc holes 43*b* may have a larger sized opening than that of the second arc holes 45*b*. The first arc holes 43*b* may be connected to the second vacuum pump 24. For example, the first arc holes 43*b* may fluidly couple the high-pressure adsorption sectors 44*b* to the second vacuum pump 24.

The second arc holes 45*b* may be disposed in low-pressure adsorption sectors 46*b*. Each of the second arc holes 45*b* may have a smaller sized opening than that of the first arc holes 43*b*. For example, when viewed from a plan view, the area of the opening of the first arc holes 43*b* is larger than the area of the opening of the second arc holes 45*b*. The second arc holes 45*b* may be connected to the third vacuum pump 26. For example, the second arc holes 45*b* may fluidly couple the low-pressure adsorption sectors 46*b* to the third vacuum pump 26.

The first and second arc holes 43*b* and 45*b* may be symmetrically arranged around a pusher hole 48 penetrating the upper chuck 40*b*. The first and second arc holes 43*b* and 45*b* may be separated from each other in directions of first and second azimuth angles $\theta 1$ and $\theta 2$. For example, each of the first and second arc holes 43*b* and 45*b* may be arranged centrally with respect to the first and second azimuth angles $\theta 1$ and $\theta 2$, respectively. In an embodiment, the first and second arc holes 43*b* and 45*b* may be disposed at the same distance from a circumference of the upper chuck 40*b*. For example, the arcing sides of each of the first and second arc holes 43*b* and 45*b* that are closest to the circumference of the upper chuck 40*b* may be equidistant from the outside edge of the upper chuck 40*b*. The first and second arc holes 43*b* and 45*b* may directly provide the upper substrate W2 with vacuum pressure generated from the second and third vacuum pumps 24 and 26. When the second and third vacuum pumps 24 and 26 generate the same vacuum pressure and/or pumping pressure, the second arc hole 45*b* may have adsorption force less than that of the first arc hole 43*b*. This may be because that the second arc hole 45*b* has an area that is smaller than that of the first arc hole 43*b*. The low-pressure and high-pressure adsorption sectors 46*b* and 44*b* may uniformly deform the upper substrate W2.

Figure 16:
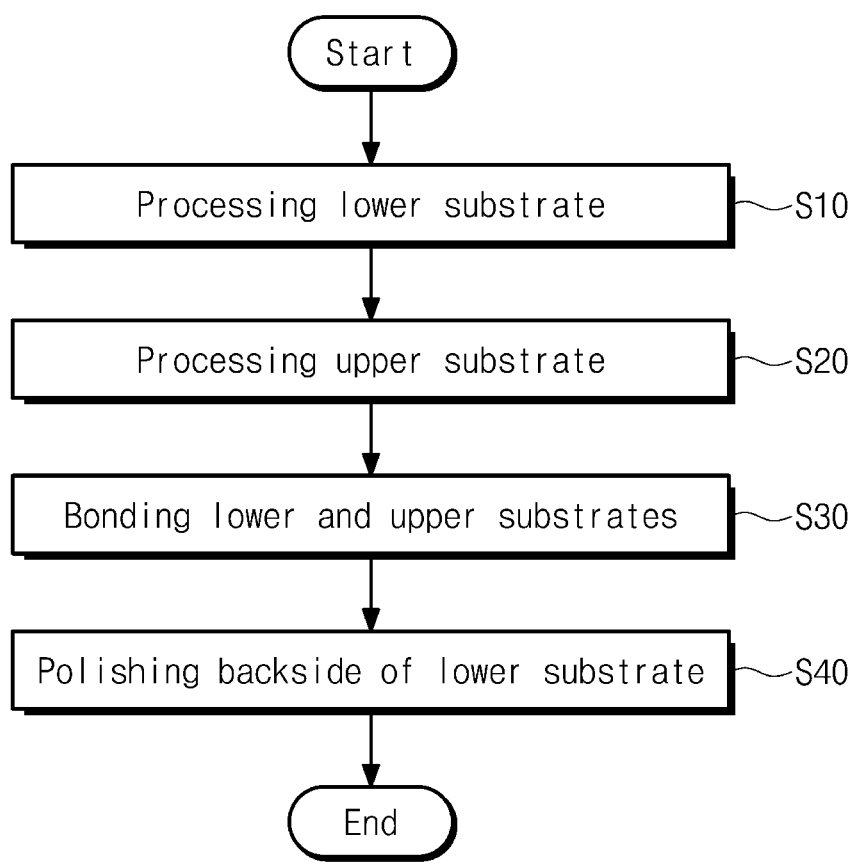
FIG. 16 is a flow chart illustrating a method of manufacturing a semiconductor device using the substrate bonding apparatus of FIGS. 1 and 2.

FIG. 16 shows a method of manufacturing a semiconductor device using the substrate bonding apparatus 100 of FIGS. 1 and 2.

Referring to FIG. 16, the method of manufacturing a semiconductor device may include processing the lower substrate W1 (S10), processing the upper substrate W2 (S20), bonding the lower and upper substrates W1 and W2 (S30), and polishing the backside surface of the lower substrate W1 (S40).

Figure 17:
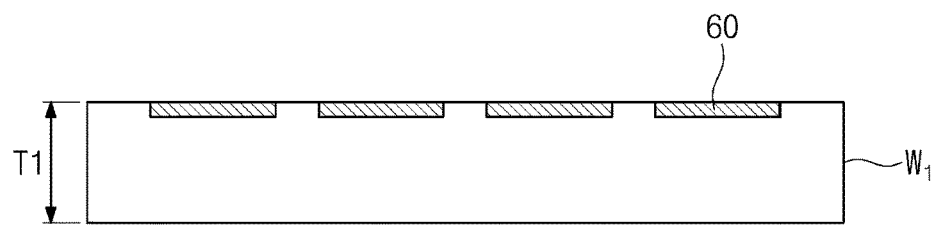
FIGS. 17 to 19 are cross-sectional views illustrating a method of manufacturing a semiconductor device of FIG. 16.
Figure 18:
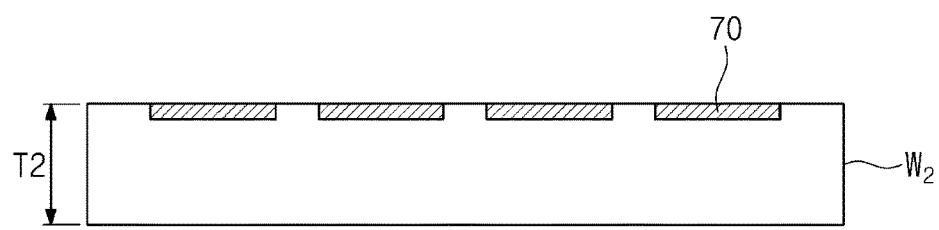
Figure 19:
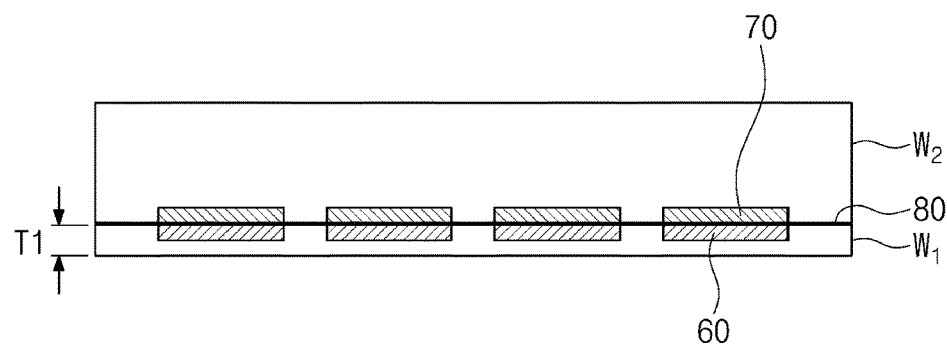

FIGS. 17 to 19 are cross-sectional views illustrating the method of manufacturing a semiconductor device of FIG. 16.

Referring to FIGS. 16 and 17, the lower substrate W1 may be processed (S10). For example, the first semiconductor devices 60 may be formed on the lower substrate W1. For example, the first semiconductor devices 60 may be formed on a top surface (or a front surface) of the lower substrate W1. In some embodiments, each of the first semiconductor devices 60 may include a pixel array of a CMOS image sensor. The lower substrate W1 may have a first thickness T1.

Referring to FIGS. 16 and 18, the upper substrate W2 may be processed (S20). The second semiconductor devices 70 may be formed on the upper substrate W2. For example, the second semiconductor devices 70 may be disposed on a top surface of the upper substrate W2. In some embodiments, the second semiconductor devices 70 may include driving members. The upper substrate W2 may have a second thickness T2.

Referring to FIGS. 8 and 16, the substrate bonding apparatus 100 may bond the lower and upper substrates W1 and W2 (S30). The adhesive layer 80 adheres the top surface of the lower substrate W1 to the top surface of the upper substrate W2. For example, a plasma treatment may allow the adhesive layer 80 to have its adhesion. The first and second semiconductor devices 60 and 70 may have their own pads (not shown) connected to each other. The pads may include metal. When the pusher 54 pushes the upper substrate W2 away from the upper chuck 40, the high-pressure and low-pressure adsorption sectors 44 and 46 may provide the upper substrate W2 with different vacuum pressure and/or pumping pressure in an azimuth direction. The high-pressure and low-pressure adsorption sectors 44 and 46 may uniformly deform the upper substrate W2 in the azimuth direction. For example, each section of the upper substrate W2 covering a range of azimuth angles may be deformed the same amount and in the same manner as the other sections of the upper substrate W2. The upper substrate W2 may be gradually bonded to the lower substrate W1 from the center to the edge of the upper substrate W2. When the upper substrate W2 is separated from the upper chuck 40, the lower substrate W1 may have its original shape without being deformed. The lower and upper substrates W1 and W2 may be prevented from failure of bonding and alignment therebetween.

Although not shown in figures, annealing may be performed on the lower and upper substrates W1 and W2. For example, the pads (not shown) of the first and second semiconductor devices 60 and 70 may be first melted and then connected to each other. A low resistance may be obtained between the first and second semiconductor devices 60 and 70.

Referring to FIGS. 16 and 19, the lower substrate W1 may be polished on its backside surface (S40). For example, a chemical mechanical polishing (CMP) method may be employed to polish the lower substrate W1. Alternatively, an etching process may be performed to thin the lower substrate W1. The lower substrate W1 may then be thinned to a first thin thickness t1 from the first thickness T1. The lower substrate W1 may not be deformed by the upper substrate W2.

According to the disclosed embodiments, a substrate bonding apparatus may include a chuck and a pusher. The chuck may have adsorption sectors. The adsorption sectors may adsorb a first substrate at different vacuum pressures in an azimuth direction. The first substrate may have different Young's moduli in the azimuth direction. The different vacuum pressures may match up with the different Young's moduli sections. When the pusher pushes the first substrate away from the chuck, the adsorption sectors may uniformly deform the first substrate in the azimuth direction. In addition, the adsorption sectors may uniformly bond the first substrate to a second substrate in the azimuth direction. When the first substrate is separated from the chuck after the first substrate is bonded to the second substrate, the first substrate may not deform the second substrate. It thus may be possible to prevent failure of bonding and alignment between the first and second substrates.

Although the present disclosure has been described in connection with the exemplary embodiments illustrated in the accompanying drawings, it will be understood to those skilled in the art that various changes and modifications may be made without departing from the technical spirit and essential feature of the present invention. It therefore will be understood that the embodiments described above are just illustrative but not limitative in all aspects.

What is claimed is:

1. A method of manufacturing a semiconductor device, the method comprising:
   fabricating a first substrate;
   fabricating a second substrate different from the first substrate; and
   bonding the first substrate to the second substrate,
   wherein bonding the first substrate to the second substrate comprises:
      adsorbing a first portion of the second substrate having a [100] or [101] crystal direction with a first vacuum pressure; and
      adsorbing a second portion of the second substrate having a [110] crystal direction with a second vacuum pressure less than the first vacuum pressure.

2. The method of claim 1, wherein fabricating the first substrate comprises:
   forming on the first substrate a pixel array of an image sensor.

3. The method of claim 2, wherein the pixel array of the image sensor is formed on a front surface of the first substrate, and wherein the method further comprises:
   polishing a backside surface of the first substrate,
   wherein the backside surface is opposite the front surface.

4. The method of claim 2, wherein fabricating the second substrate comprises:
   forming driving members that control the pixel array of the image sensor, where the driving members are disposed on the second substrate.

5. The method of claim 4, wherein the driving members are bonded to the pixel array of the image sensor.

6. The method of claim 1, wherein the first vacuum pressure is provided to the first portion of the second substrate at the same time that the second vacuum pressure is provided to the second portion of the second substrate.

7. The method of claim 6, wherein the first vacuum pressure is greater than the second vacuum pressure, and the first portion of the second substrate has a lower Young's modulus than the second portion of the second substrate.

8. A method comprising:
   providing a first substrate;
   providing a first chuck having first adsorption sectors configured to adsorb the first substrate at a first pressure and second adsorption sectors configured to adsorb the first substrate at a second pressure different from the first pressure;
   aligning the first substrate with the first chuck so that the first adsorption sectors align with first portions of the first substrate having a [110] crystal direction aligned radially from a center of the first substrate toward an edge of the first substrate, and so that the second adsorption sectors align with second portions of the first substrate having a [100] or [010] crystal direction aligned radially from a center of the first substrate toward an edge of the first substrate;
   adsorbing the first substrate to the first chuck; and
   pushing the first substrate away from the first chuck by pushing the first substrate at a center of the first substrate.

9. The method of claim 8, wherein:
   the first pressure is smaller than the second pressure.

10. The method of claim 8 wherein an alignment pin disposed on an edge of the first chuck is used to perform the aligning.

11. The method of claim 8, wherein each of the first and second adsorption sectors has an azimuth angle of about 45°.

12. The method of claim 8,
   wherein the first adsorption sectors comprise holes configured to fluidly connect the first adsorption sectors to a first vacuum pump, and
   wherein the second adsorption sectors comprise holes configured to fluidly connect the second adsorption sectors to a second vacuum pump.

13. The method of claim 12,
   wherein the first vacuum pump provides the first adsorption sectors with a first vacuum pressure; and
   wherein the second vacuum pump provides the second adsorption sectors with a second vacuum pressure greater than the first vacuum pressure.

* * * * *